(12) United States Patent
Brahim et al.

(10) Patent No.: US 8,309,226 B2
(45) Date of Patent: *Nov. 13, 2012

(54) ELECTRICALLY CONDUCTIVE TRANSPARENT COATINGS COMPRISING ORGANIZED ASSEMBLIES OF CARBON AND NON-CARBON COMPOUNDS

(75) Inventors: Sean Imtiaz Brahim, Camarillo, CA (US); Robert L. Gump, Camarillo, CA (US); Steven G. Colbern, Fillmore, CA (US); Leonid Grigorian, Camarillo, CA (US)

(73) Assignee: Yazaki Corporation, Tokyo (JP)

( * ) Notice: Subject to any disclaimer, the term of this patent is extended or adjusted under 35 U.S.C. 154(b) by 1037 days.

This patent is subject to a terminal disclaimer.

(21) Appl. No.: 12/182,009

(22) Filed: Jul. 29, 2008

(65) Prior Publication Data
US 2009/0035555 A1  Feb. 5, 2009

Related U.S. Application Data

(60) Provisional application No. 60/953,744, filed on Aug. 3, 2007.

(51) Int. Cl.
*B32B 9/00* (2006.01)
(52) U.S. Cl. ................................................ 428/408
(58) Field of Classification Search .................. 428/408; 427/447.1, 447.3; 165/185; 977/742; 252/502
See application file for complete search history.

(56) References Cited

U.S. PATENT DOCUMENTS

| | | | |
|---|---|---|---|
| 6,090,363 A * | 7/2000 | Green et al. ............... 423/447.1 |
| 7,060,241 B2 | 6/2006 | Glatkowski | |
| 7,119,028 B1 | 10/2006 | Roberts | |
| 7,794,840 B2 * | 9/2010 | Grigorian et al. ............. 428/408 |
| 7,938,987 B2 * | 5/2011 | Grigorian et al. ............. 252/502 |
| 2004/0099438 A1 | 5/2004 | Arthur | |
| 2004/0197546 A1 * | 10/2004 | Rinzler et al. ........... 428/311.51 |
| 2005/0089684 A1 | 4/2005 | Barron et al. | |
| 2006/0274048 A1 | 12/2006 | Spath | |
| 2006/0284162 A1 | 12/2006 | Kurt | |
| 2008/0003182 A1 | 1/2008 | Wilson et al. | |
| 2008/0066802 A1 | 3/2008 | Reddy | |
| 2009/0072192 A1 | 3/2009 | Seal et al. | |
| 2010/0117032 A1 * | 5/2010 | Grigorian et al. ............. 252/507 |

FOREIGN PATENT DOCUMENTS

JP  2006269311 A2  10/2006
(Continued)

OTHER PUBLICATIONS

Bao J. et al., "Synthesis and magnetic behavior of an array of nickel-filled carbon nanotubes," Applied Physics Letters, vol. 81, No. 24, Dec. 9, 2002, pp. 4592-4594.

(Continued)

*Primary Examiner* — Maria Veronica Ewald
*Assistant Examiner* — Daniel H Miller
(74) *Attorney, Agent, or Firm* — Perkins Coie LLP.; Viola T. Kung

(57) ABSTRACT

This invention is directed to an article comprising a transparent substrate and an electrically conductive transparent coating deposited on the transparent substrate. This invention is also directed to methods for preparing the electrically conductive transparent coating and depositing the coating on the transparent substrate. This invention is further directed to devices containing such articles. The electrically conductive transparent coating comprises carbon nanotubes filled, coated, or both filled and coated by a non-carbon material.

8 Claims, 6 Drawing Sheets

FOREIGN PATENT DOCUMENTS

| WO | WO 2004052559 A | 6/2004 |
|----|----|----|
| WO | WO 2005/005687 A1 | 1/2005 |
| WO | WO 2007004758 A1 | 1/2007 |
| WO | WO 2007/130869 A2 | 11/2007 |
| WO | WO 2008001998 A1 | 1/2008 |

OTHER PUBLICATIONS

Canestraro et al., "Carbon nanotubes based nanocomposites for photocurrent improvement", *Applied Surface Science* 252 (2006), pp. 5575-5578.

Ginley et al., "Transparent Conducting Oxides", MRS Bulletin, www.mrs.org/publications/bulletin, pp. 15-18, Aug. 2000.

Gordon, Roy G., "Criteria for Choosing Transparent Conductors", MRS Bulletin, www.mrs.org/publications/bulletin, pp. 52-57, Aug. 2000.

Jin Zhao-xia et al., "A preferentially ordered accumulation of bromine on multi-wall carbon nanotubes," Carbon, Elsevier, Oxford, GB, vol. 38, No. 8, Jan. 1, 2000, pp. 1135-1139.

Kong et al., "Enhancement in Electrical Conductivity of Transparent Single-Walled Carbon Nanotube Films", Proceedings of the 2nd IEEE International Conference on Nano/Micro Engineered and Molecular Systems, Jan. 16-19, 2007, pp. 203-206, Bangkok, Thailand.

Kong et al., "Single-Walled Carbon Nanotube Gold Nanohybrids: Application in Highly Effective Transparent and Conductive Films", *J. Phys. Chem. C* 2007, 111(23), pp. 8377-8382.

Lewis et al., "Applications and Processing of Transparent Conducting Oxides", MRS Bulletin, www.mrs.org/publications/bulletin, pp. 22-27, Aug. 2000.

Li et al., "Simulations of optical properties of aligned metal filled carbon nanotube embedded in an insulating medium," Materials Letters, North Holland Publishing Company, Amsterdam, NL, vol. 59, No. 27, Nov. 1, 2005, pp. 3445-3447.

Li et al., "Does the wall number of carbon nanotubes matter as conductive transparent material?", Applied Physics Letters 91, 053115 (2007).

Wu et al., "Transparent, Conductive Carbon Nanotube Films", *Science* 205, pp. 1273-1276, Aug. 27, 2004.

Zhang et al., "Strong, Transparent, Multifunctional, Carbon Nanotube Sheets", *Science* 309, pp. 1215-1219, Aug. 19, 2005.

International Search Report for PCT/US2008/071487, mailed Dec. 18, 2008.

Monthioux, M. "Filling single-wall carbon nanotubes." Carbon, vol. 40, pp. 1809-1823, 2002.

Satishkumar, et al. "Novel experiments with carbon nanotubes: opening, filling, closing and functionalizing nanotubes." J. Phys. B, vol. 29, pp. 4925-4934, 1996.

* cited by examiner

ELECTRICALLY CONDUCTIVE TRANSPARENT COATINGS COMPRISING ORGANIZED ASSEMBLIES OF CARBON AND NON-CARBON COMPOUNDS

This application claims priority to U.S. Provisional Patent Application No. 60/953,744, filed on Aug. 3, 2007, which is incorporated herein by reference.

TECHNICAL FIELD

This invention relates generally to electrically conductive transparent coatings comprising organized assemblies of carbon and non-carbon compounds, particularly carbon nanotubes filled with non-carbon materials. This invention further relates to an article comprising a transparent substrate and the electrically conductive transparent coating deposited on the transparent substrate. It also relates to devices containing such articles. In preferred embodiments, the organized assemblies of the instant invention are made up of nanorods or their aggregate forms.

BACKGROUND OF THE INVENTION

There are numerous potential applications of carbon nanotubes (CNTs) because of their unique mechanical, physical, electrical, chemical and biological properties. For example, ultra low resistance conductors, semiconductors, highly efficient electron emitters, ultra-strong lightweight fibers for structural applications, lasers, and gas sensors can all be manufactured by using CNTs. For reviews of CNT technology, properties and applications, see Baughman et al., "Carbon Nanotubes—the Route Toward Applications", Science, volume 297, pages 787-792 (2002); Michael J. O'Connell (Editor) "Carbon Nanotubes—Properties and Applications", CRC Taylor & Francis, New York (2006); Yury Gogotsi (Editor) "Nanomaterials Handbook", CRC Taylor & Francis, New York (2006).

Pure multi-wall or single-wall CNTs may be used to replace oxides such as indium tin oxide (ITO) in production of electrically conductive transparent coatings deposited on electrically insulating transparent substrates. For example, see Gruner, "Carbon Nanotube Films for Transparent and Plastic Electronics", J. Mater. Chem., volume 16, pages 3533-3539 (2006); Wu et al., "Transparent Conductive Carbon Nanotube Films", Science, volume 305, pages 1273-1276 (2004); Schmidt et al., "The Effect of Aggregation on the Electrical conductivity of Spin-Coated Polymer/Carbon Nanotube Composite Films", Langmuir, volume 23, pages 5707-5712 (2007); Gruner, "Carbon Nanonets Spark New Electronics", Scientific American, pages 76-83, May (2007); Zhongrui et al., "Does the Wall Number of Carbon Nanotubes Matter as Conductive Transparent Material?", Appl. Phys. Lett., volume 91, pages 053115-1-053115-3 (2007); Glatkowski et al., "Coatings Comprising Carbon Nanotubes and Methods for Forming Same", U.S. Pat. No. 7,060,241; Arthur et al. "Method for Patterning Carbon Nanotube Coating and Carbon Nanotube Wiring", U.S. Patent Application Publication No. 2004/0099438; and Rinzler et al., "Transparent Electrodes from Single Wall Carbon Nanotubes", U.S. Patent Application Publication No. 2004/0197546A1.

A variety of synthesis techniques for preparing CNTs exist. These techniques include for example carbon arc, laser ablation, chemical vapor deposition, high pressure carbon monoxide process (HiPco), and cobalt-molybdenum catalyst process (CoMoCat). These techniques yield products that comprise a mixture of metallic and semiconducting CNTs. Depending on the preparation method, the semiconducting component of this mixture may easily be higher than 65%, which may severely limit the application of these materials in preparation of electrically conductive transparent coatings.

In a publication entitled "Titanium Monomers and Wires Adsorbed on Carbon Nanotubes: A First Principles Study", Nanotechnology, volume 17, pages 1154-1159 (2006), Fagan et al. describe a theoretical study of Ti monomers and wires interacting with a semiconductor single-wall carbon nanotube, by inside as well as outside faces. Fagan et al. only provide a theoretical study without actual data.

In sum, there exists a need for new or improved electrically conductive transparent coatings and methods of making these materials.

SUMMARY OF THE INVENTION

Figure 1:
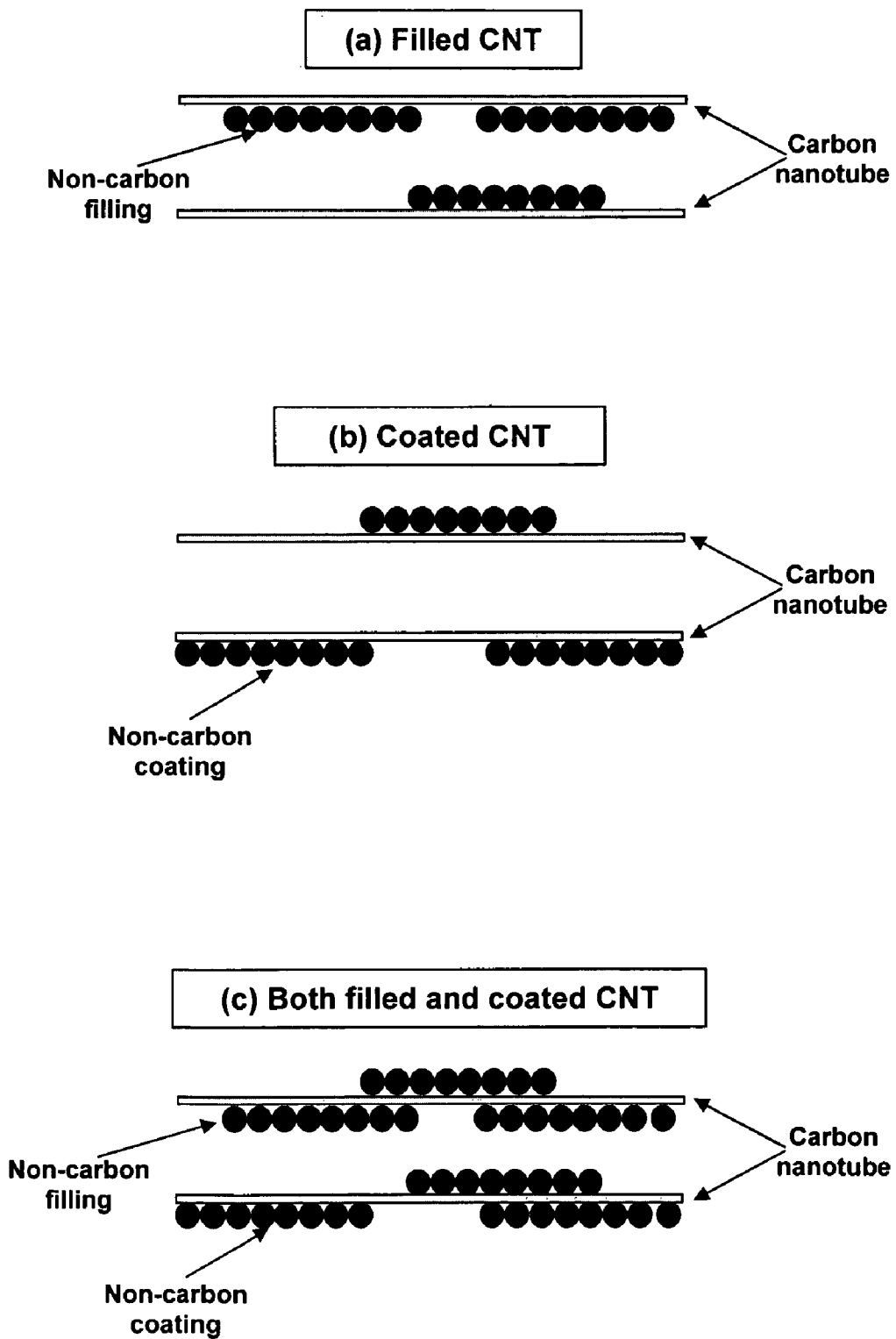
FIG. 1 is a schematic diagram of the types of the organized carbon and non-carbon assembly of the instant invention.

The present invention is directed to an article comprising a transparent substrate and an electrically conductive transparent coating deposited on the transparent substrate. In one embodiment, the coating comprises carbon nanotubes filled with one or more non-carbon materials comprising a titanium compound, a manganese compound, iron, iron hydride, cobalt, cobalt hydride, nickel, nickel hydride, palladium, palladium hydride, platinum, platinum hydride, a halogen, an interhalogen compound, or the combination thereof. In another embodiment, the coating comprises carbon nanotubes that were previously reacted with a halogen precursor comprising a halogen or an interhalogen compound, and then their halogen contents were partially or completely removed. The transmittance of the coating at about 550 nm wavelength is at least 30%; and the surface electrical resistance of the coating is no more than $50 \times 10^3$ ohms/square. The carbon nanotubes are optionally further coated with a second non-carbon material.

This invention is also directed to methods for preparing the electrically conductive transparent coating as described above and depositing the coating on a transparent substrate. This invention is further directed to devices containing such articles.

The electrically conductive transparent coating of the present invention provides improved transparency and electrical conductivity, thus they are useful in replacing conventional coatings in the devices. For example, the electrically conductive transparent coating of the present invention can replace the conventional ITO electrodes in liquid crystal displays, field emission displays and plasma display panels.

DETAILED DESCRIPTION OF THE INVENTION

The inventors have discovered an electrically conductive transparent coating composition useful for coating a transparent substrate. The coating provides high transparency, i.e., the transmittance of the coating at about 550 nm wavelength is at least 30%, preferably at least 60%, more preferably at least 80%. The coating also provides good electrical conductivity, i.e., the surface electrical resistance of the coating is no more than $50 \times 10^3$ ohms/square, preferably no more than $10 \times 10^3$ ohms/square, and more preferably no more than $1 \times 10^3$ ohms/square. The coating comprises organized assemblies of carbon and non-carbon compounds, particularly carbon nanotubes filled with non-carbon materials, or carbon nanotubes that were previously reacted with a halogen precursor comprising one or more halogens or interhalogen compounds, and then their halogen contents were partially or completely removed.

Organized Assemblies of Carbon and Non-Carbon Materials

The organized assemblies of carbon and non-carbon materials useful for this invention are made up of one or more types of a repeating unit and may adopt different shapes, such as a rod, spherical, semi-spherical, or egg shape. At least one dimension of the repeating unit is typically smaller than 1,000 nm, preferably smaller than 100 nm, or more preferably smaller than 10 nm. A cross-section of a repeating unit may resemble a circular, oval or rectangular shape. Typically, individual repeating units (or different types of repeating units) aggregate to nanometer size fragments. In a preferred embodiment, a repeating unit of this invention may be a nanorod comprising nanocarbon and non-carbon materials.

Many forms of carbon are suitable for the electrically conductive transparent coatings of this invention. These forms of carbon include for example amorphous carbon, graphite, a carbon nanotube, or a mixture thereof. In preferred embodiments of this invention, the carbon is in a form of a carbon nanotube filled with one or more non-carbon materials. In another preferred embodiment of this invention, the carbon nanotube comprises one or more layers of carbon. Examples of the carbon nanotube are single wall carbon nanotubes (SWCNTs), multi-wall carbon nanotubes (MWCNTs) or a mixture thereof. In yet another embodiment, the carbon may be a SWCNT that has an external diameter varying in the range of 0.65-3.0 nanometers.

Many non-carbon materials are suitable for incorporation into the carbon nanotubes of this invention. Non-carbon materials may comprise a metal (or a metal compound) or a non-metal material. For example, a non-carbon material may comprise magnesium (Mg), magnesium hydride ($MgH_2$), magnesium diboride ($MgB_2$), magnesium nitride ($Mg_3N_2$), magnesium oxide (MgO), strontium (Sr), scandium (Sc), scandium nitride (ScN), yttrium (Y), titanium (Ti), titanium hydride ($TiH_2$), titanium nitride (TiN), titanium diboride ($TiB_2$), titanium oxide ($TiO_2$), zirconium (Zr), zirconium diboride ($ZrB_2$), zirconium nitride (ZrN), hafnium (Hf), hafnium nitride (HfN), vanadium (V), vanadium diboride ($VB_2$), niobium (Nb), niobium diboride ($NbB_2$), niobium nitride (NbN), tantalum (Ta), chromium (Cr), chromium diboride ($CrB_2$), manganese (Mn), iron (Fe), cobalt (Co), nickel (Ni), palladium (Pd), platinum (Pt), boron (B), boron hydrides, boron nitride (BN), boron oxide ($B_2O_3$), bromine ($Br_2$), iodine ($I_2$), interhalogen compounds (such as IBr, $ICl_3$, $BrF_3$) and a mixture (or alloy) thereof. Non-stoichiometric compounds of the non-carbon material are also within the scope of this invention. In addition, the non-carbon material may be amorphous or crystalline. The crystalline form could be distorted, for example by having deficiencies in the crystal structure.

Particularly, the present invention is directed to electrically conductive transparent coatings comprising a carbon and a non-carbon comprising a titanium compound, zirconium, zirconium hydride, hafnium, hafnium hydride, vanadium, vanadium hydride, a manganese compound, iron, iron hydride, cobalt, cobalt, cobalt hydride, nickel, nickel hydride, palladium, palladium hydride, platinum, platinum hydride, copper, copper hydride, zinc, zinc hydride, bromine, iodine, an interhalogen compound, or the combination thereof. An "interhalogen compound," as used herein, refers to a compound comprising more than one type of halogen atom, for example, IBr, $ICl_3$, or $BrF_3$.

In one embodiment of this invention, the non-carbon material comprises a titanium compound. A titanium compound, as used herein, refers to a compound that contains titanium. For example, a titanium compound may be titanium, a titanium hydride, a titanium boride, a titanium nitride, a titanium oxide, or a mixture thereof. In particular, a titanium compound may be abbreviated with a formula $TiH_wB_xN_yO_z$, where w varies in the range of 0 to 2, x varies in the range of 0 to 2, y varies in the range of 0 to 1, and z varies in the range of 0 to 2. Non-stoichiometric titanium compounds are also within the scope of this invention. For example, the titanium compound may be $TiO_{1.354}$.

In another embodiment of this invention, the non-carbon material comprises a manganese compound. A manganese compound, as used herein, refers to a compound that contains manganese. For example, a manganese compound may be manganese, a manganese hydride, a manganese nitride, a manganese oxide, or a mixture thereof. In particular, a manganese compound may be abbreviated with a formula $MnH_{w'}B_{x'}N_{y'}O_{z'}$, where w' varies in the range of 0 to 4, x' varies in the range of 0 to 2, y' varies in the range of 0 to 1, and z' varies in the range of 0 to 2. Non-stoichiometric manganese compounds are also within the scope of this invention. For example, the manganese compound may be $MnO_{1.782}$.

The non-carbon material may also comprise limited amount of metal carbides, such as titanium carbide, silicon carbide, vanadium carbide, tantalum carbide, or a mixture thereof, with an amount preferably no more than 10 volume percent.

As a repeating unit, the non-carbon material may fill, coat, or both fill and coat the carbon nanotube (CNT). These three cases are schematically shown in FIG. 1(a) to (c). In the first case shown in FIG. 1(a), the non-carbon material fills the core of the CNT. The organized assemblies of the first case are abbreviated hereafter as "non-carbon material filled carbon," for example, as Ti filled SWCNTs or $Ti^f$-SWCNTs; where superscript "f" is an abbreviation for "filled". In the second case shown in FIG. 1(b), the non-carbon material coats the CNT. The organized assemblies of this case are hereafter abbreviated as "non-carbon material coated carbon," for example, as Ti coated SWCNTs or $Ti^c$-SWCNTs; where superscript "c" is an abbreviation for "coated". In the third case shown in FIG. 1(c), the non-carbon material both fills and coats the CNT. The organized assemblies of this case are hereafter abbreviated as "non-carbon material filled and coated carbon," for example, as Ti filled and coated SWCNTs or $Ti^{f\&c}$-SWCNTs; where superscript "f&c" is an abbreviation for "filled and coated". The electrically conductive transparent coatings of the present invention preferably comprise carbon nanotubes filled with one or more non-carbon materials. The filled nanotubes are optionally coated with one or more non-carbon materials.

The repeating unit may be partially hollow. For example, the core of a SWCNT may be partially empty. The empty portion of the core may be no more than 95 volume %, no more than 75 volume %, no more than 50 volume %, no more than 25 volume %, or no more than 10 volume %. The coating, filling, or coating and filling by the non-carbon material may have a continuous or non-continuous form. For example, they may be in the form of a continuous film deposited on the outer or inner surface of a SWCNT, islands deposited on the outer or inner surface of a SWCNT, beads deposited on the surface of a SWCNT, or particulates deposited in the core of a SWCNT.

Method for Preparing Carbon Nanotubes Containing Non-Carbon Materials

The organized assembly of carbon and non-carbon materials of the present invention is prepared by a method comprising a step of reacting carbon nanotubes with a halogenated precursor to generate a halogenated intermediate.

Carbon nanotubes used as carbon precursors are hereafter referred as "carbon nanotubes" or "starting carbon nanotubes", for example, a carbon nanotube (CNT), MWCNTs, starting MWCNTs, SWCNTs or starting SWCNTs.

The carbon nanotube suitable for this invention may be prepared by any synthesis method. Such methods may include, but are not limited to, carbon arc, laser vaporization, chemical vapor deposition (CVD), high pressure carbon monoxide process (HiPco), cobalt-molybdenum catalyst process (CoMoCat). The carbon nanotube may be a mixture of carbon nanotubes prepared by more than one synthesis method.

In one embodiment of the method, the carbon nanotube may be used as purchased. In another embodiment, amorphous carbons and/or catalysts may be removed from the as-purchased carbon nanotubes before the application of the disclosed method. The amorphous carbon and/or the catalyst removal may be complete or partial. Thus, a carbon nanotube may contain any level of amorphous carbon and/or catalyst. The invention is not limited to any particular method of removing the amorphous carbon and/or the catalyst from the starting SWCNTs. As an example, the method disclosed by Delzeit et al. in U.S. Pat. No. 6,972,056 may be used for this removal.

A halogenated precursor may comprise a halogenated compound; such as magnesium iodide ($MgI_2$), scandium iodide ($ScI_3$), scandium bromide ($ScBr_3$), yttrium iodide ($YI_3$), yttrium bromide ($YBr_3$), zirconium iodide ($ZrI_4$), zirconium bromide ($ZrBr_4$), titanium iodide ($TiI_4$), titanium bromide ($TiBr_4$), vanadium iodide ($VI_3$), vanadium bromide ($VBr_3$), niobium iodide ($NbI_4$), niobium bromide ($NbBr_4$), tantalum iodide ($TaI_4$), tantalum bromide ($TaBr_5$), chromium iodide ($CrI_3$), chromium bromide ($CrBr_3$), iron iodide ($FeI_2$), cobalt iodide ($CoI_2$), nickel iodide ($NiI_2$), palladium iodide ($PdI_2$), platinum iodide ($PtI_2$), boron iodide ($BI_3$), bismuth iodide ($BiI_3$), bismuth bromide ($BiBr_3$), or a mixture thereof. The amount of the halogenated compound in a halogenated precursor may be at least 0.001 weight %, at least 0.01 weight %, at least 0.1 weight %, at least 1 weight %, at least 10 weight %, at least 50 weight %, or at least 80 weight %.

In another embodiment, a halogenated precursor suitable for this invention may comprise a halogen; such as iodine, bromine, an interhalogen compound (such as $IBr$, $ICl_3$, $BrF_3$), or a mixture thereof. The amount of the halogen in a halogenated precursor may be at least 0.001 weight %, at least 0.01 weight %, at least 0.1 weight %, at least 1 weight %, at least 10 weight %, at least 50 weight %, or at least 80 weight %.

In addition to the above-described active ingredients, a halogenated precursor may also comprise inactive ingredients such as inert diluents, impurities, etc.

The amount of non-carbon material present in the halogenated precursor controls the amount of non-carbon material incorporated into the assembly. Thus, by varying the ratio of the non-carbon material amount to the carbon precursor, the non-carbon material content of the final composition can be varied.

Ends of the as-purchased carbon nanotubes are typically closed, i.e. they are end-capped. The end-caps may prevent direct filling of cores of the as-purchased carbon nanotubes with the non-carbon materials. In some previously disclosed filling methods, the end-caps are removed prior to the filling step by using acids such as nitric acid or by controlled oxidation at elevated temperatures. Such end-cap removal methods may cause partial or excessive removal of carbon and formation of defects, thereby degrading the useful properties of the carbon nanotubes.

The presence of the halogen in the halogenated precursor may aid in filling of the carbon nanotubes with the non-carbon materials without necessitating a separate end-cap removal step prior to the filling, thereby simplifying the process. Also, such filling may be achieved without any degradation of useful properties of the carbon nanotubes. The presence of the halogen may also increase the amount of filling of carbon nanotubes by non-carbon materials, thereby improving the yield and desired properties of the organized assembly. Furthermore, the presence of the halogen may decrease the viscosity of the halogenated precursor, thereby promoting better infiltration and shorter process duration.

Some halogenated compounds may have impractically high melting points (e.g., 587° C. for $FeI_2$, 780-797° C. for $NiI_2$, 613-638° C. for $MnI_2$), and if the reaction is carried high temperatures, the carbon nanotubes may irreversibly be damaged, diminishing the useful properties of the organized assembly. However, incorporating the halogens such as bromine with a melting point of −7.3° C. or iodine with a melting point of 113.6° C. into the halogenated precursor may substantially reduce the reaction temperature and prevent any property degradation.

Thus, there are several advantages of incorporating a halogen into the halogenated precursor, including achieving filling with no end-cap removal prior to the filling, increasing the filling yield, and reducing the reaction temperature and time.

The reaction between the carbon and the halogenated precursor may occur at a temperature at which the halogenated precursor is a liquid. This temperature may be at or above the melting temperature of the halogenated precursor. For example, if the halogenated precursor is about 100 weight % $TiI_4$, the reaction may be carried out at a temperature above the melting point of $TiI_4$, which is about 150° C. When 100% $TiBr_4$ is a halogenated precursor, the reaction temperature may be above the melting point of $TiBr_4$, i.e., about 28° C. As another example, if the precursor is a mixture of a halogenated compound and a halogen, the reaction may be carried out at or above a temperature at which this mixture forms a liquid. For example, when a mixture of $TiI_4$ and $I_2$ is a halogenated precursor, the reaction may be carried out at a temperature above the melting point of iodine, i.e., about 113.6° C. Since bromine is liquid at room temperature, the reaction may be carried out at a temperature above 20° C. when a mixture of a halogenated compound and bromine is used as the halogenated precursor. In one embodiment, the carbon precursor and the halogenated precursor may be reacted at a temperature above 20° C., above 100° C., above 150° C., or above 200° C. for a per longer than 1 minute, longer than 10 minutes, or longer than 20 minutes.

In an optional process step, the carbon may be heated above room temperature to remove adsorbed volatile compounds, such as water, before the step of reacting the carbon with the halogenated precursor. The volatile compound removal may be achieved by heating the carbon precursor above 100° C. or above 200° C. for a period longer than 10 minutes.

After the reaction between the carbon and the halogenated precursor, a halogenated intermediate (a carbon nanotube that is filled, coated, or both filled and coated) is produced. This halogenated intermediate may be used directly in preparation of the electrically conductive transparent coatings of the instant invention. For example, iodine filled and coated SWCNTs may be used in preparation of such coatings.

As another optional process step, the halogen is removed from the halogenated intermediate before the step of preparation of the coatings. The halogen removal may be complete or partial. Thus, a carbon nanotube may contain any level of halogen.

During the reaction between the carbon precursor and the halogenated precursor, the halogenated precursor may intercalate between layers of the carbon precursor, open the end caps of the carbon nanotubes and fill their cores, coat the carbon precursor, or both fill (i.e., intercalate) and coat the carbon precursor. As a result, the halogenated intermediate may contain halogen, in a free form, such as iodine, and/or in a form of a halogenated compound, such as $TiI_4$. It may be necessary to reduce the halogen level of the organized assembly to prepare an electrically conductive transparent coating with desired properties. The halogen removal may be achieved by sublimation, evaporation, or thermal degradation. The halogen removal may also be achieved by reacting the halogenated intermediate with a suitable reactant, for example, hydrogen.

In particular, the halogen removal step may comprise heating the halogenated intermediate at a temperature for a period sufficient enough to reduce the halogen content of the intermediate to a desired level. For example, the halogen removal step may be carried out at a temperature above 200° C., above 300° C., above 500° C., or above 800° C. for a period longer than 5 minutes, longer than 10 minutes, longer than 30 minutes, or longer than 1 hour. In one embodiment, this heating may be carried out in a gas mixture comprising hydrogen at a temperature for a period sufficient enough to reduce the halogen content of the intermediate below 10 weight %. For example, the heating step may be carried out in a gas mixture comprising at least 0.01 volume % or at least 1 volume % hydrogen at a temperature above 200° C., above 300° C., above 500° C., or above 800° C. for a period longer than 5 minutes, longer than 10 minutes, longer than 30 minutes, or longer than 1 hour. The heating may be carried out below 1 atmosphere pressure.

The halogen removal may also be achieved by washing the halogenated intermediate with a suitable solvent. This solvent may be an alcohol such as ethanol. The halogen removal by solvent washing may be complete or partial. Thus, a carbon nanotube may contain any level of halogen after the solvent washing. For example, this washing may completely remove the halogenated precursor coating if a suitable solvent is used and/or if the solvent washing step is repeated several times. This washing may also partially remove the halogenated coating, for example, thereby incorporating a coating that has a particulate form to the carbon. The amount of the coating then may be varied by controlling the solvent type, solvent amount, and number of repetition of washing steps.

After the halogenation removal step, an organized assembly comprising a carbon and a non-carbon material (such as metal, metal like compound, metal boride, or a mixture thereof) is obtained. Specific examples of such non-carbon material include magnesium (Mg), strontium (Sr), scandium (Sc), yttrium (Y), titanium (Ti), zirconium (Zr), hafnium (Hf), vanadium (V), vanadium diboride ($VB_2$), niobium (Nb), tantalum (Ta), chromium (Cr), manganese (Mn), iron (Fe), cobalt (Co), nickel (Ni), palladium (Pd), platinum (Pt), boron (B), bismuth (Bi), and a mixture (or alloy) thereof.

For an organized assembly comprising (1) a carbon and (2) a non-carbon hydride, boride, nitride, oxide, or a mixture thereof, the method further includes hydrogenation, reaction with boron compounds, nitrogenation, and/or oxidation of the product after the halogen removal step. The hydrogenation may be carried out above room temperature in a gas mixture containing hydrogen, ammonia, or hydrazine. The reaction with boron compounds may be carried out by reacting the product with boron hydrides, for example $B_2H_6$, $B_5H_{11}$. The nitrogenation may be carried out above room temperature in a gas mixture containing nitrogen, ammonia, hydrazine, or a mixture thereof. The oxidation may be carried out at room temperature or above in a gas mixture containing oxygen.

As a result of hydrogenation, reaction with boron compounds, nitrogenation, and/or oxidation, the assembly comprising (1) a carbon and (2) a non-carbon (such as metal) hydride, boride, nitride, oxide, or a mixture thereof is formed. Some examples of such non-carbon material include magnesium hydride ($MgH_2$), magnesium diboride ($MgB_2$), magnesium nitride ($Mg_3N_2$), magnesium oxide (MgO), scandium nitride (ScN), titanium hydride ($TiH_2$), titanium diboride ($TiB_2$), titanium nitride (TiN), titanium oxide ($TiO_2$), zirconium diboride ($ZrB_2$), zirconium nitride (ZrN), hafnium nitride (HfN), niobium diboride ($NbB_2$), niobium nitride (NbN), boron hydrides, boron nitride (BN), boron oxide ($B_2O_3$), chromium diboride ($CrB_2$), boron nitride (BN), and a mixture thereof.

In one embodiment of this invention, the organized assembly comprising non-carbon material filled and coated carbon, such as Ti filled and coated SWCNT may be prepared by both filling and coating the carbon nanotube with the halogenated precursor. To achieve the filling, the size of the core is preferably selected to be larger than that of the halogenated precursor. For example, a halogenated compound, $TiI_4$ has a size of about 1 nm. During the halogenation reaction, this compound can fill the cores of SWCNTs that have inner diameters larger than 1 nm. For example, since the SWCNTs prepared by the carbon arc process have inner diameters larger than 1 nm, these SWCNTs may be both filled and coated with $TiI_4$. After the removal of iodine from the SWCNTs, Ti filled and coated SWCNTs are generated.

In another embodiment, the non-carbon material coated carbon nanotube, such as Ti coated SWCNT may be prepared by coating the carbon nanotube with the halogenated precursor. To achieve the coating but not filling, the size of the core is preferably selected be smaller than that of the halogenated precursor. For example, a halogenated compound $TiI_4$ has a size of about 1 nm and the SWCNTs prepared by CoMoCat process have inner diameters smaller than 1 nm. Therefore, during the halogenation reaction, $TiI_4$ coats but does not fill the cores of these SWCNTs. After the removal of iodine, Ti coated SWCNTs are produced.

In yet another embodiment, the non-carbon material filled carbon, such as Ti filled SWCNTs may be prepared by washing the halogenated precursor coated and filled carbon nanotubes with a suitable solvent, such as ethanol. This washing may remove the halogenated precursor coating, but not the filling at the carbon nanotube core. Then, after the iodine removal, Ti filled SWCNTs are produced.

Thus, by choosing the core size of the carbon nanotube, or by incorporating a solvent wash step, the non-carbon materials may fill, coat, or both fill and coat the carbon nanotubes.

In one embodiment of the invention, the method comprises first filling the carbon nanotube and then further filling and/or coating the filled carbon nanotube with a second non-carbon material. The further filling and/or coating with the second non-carbon may be achieved by following the methods disclosed above.

Articles Comprising Electrically Conductive Transparent Coatings

The present invention is directed to an article comprising a transparent substrate, and an electrically conductive transparent coating deposited on the transparent substrate. The coating comprises carbon nanotubes filled or filled and coated with one or more non-carbon materials comprising a titanium compound, a manganese compound, iron, iron hydride, cobalt, cobalt hydride, nickel, nickel hydride, palladium, palladium hydride, platinum, platinum hydride, copper, copper hydride, zinc, zinc hydride, a halogen, an interhalogen compound, or the combination thereof. The one or more non-carbon materials preferably comprise a titanium compound, a manganese compound, iron, iron hydride, cobalt, cobalt hydride, nickel, nickel hydride, palladium, palladium hydride, platinum, platinum hydride, a halogen, an interhalogen compound, or the combination thereof.

The transmittance of the coating of the present invention at about 550 nm wavelength is at least 30%, preferably at least 60%, and more preferably at least 80%. The surface (i.e. sheet) resistance of the coatings of the present invention is no more than $50 \times 10^3$ ohms/square, preferably no more than $10 \times 10^3$ ohms/square, and more preferably no more than $1 \times 10^3$ ohms/square.

The transparency and the electric resistance of these coatings depend on the coating thickness. If these coatings are very thick, their transmittance and thereby their transparency decrease; below a level of transparency, such very thick coatings become no longer suitable for commercial applications. If the coatings are very thin, their mechanical strength degrades and also their surface electrical resistance may increase to above a level not suitable for commercial applications. Incorporation of different non-carbon materials in carbon nanotubes may affect the transparency and/or electric resistance dependence on thickness. In one embodiment of this invention, the coatings comprising of the present invention have thicknesses in the range of 40 nm to 1,500 nm. In another embodiment of this invention, the coating thickness is in the range of 200 nm to 1,000 nm.

The carbon nanotubes filled with or filled and coated with non-carbon materials are deposited on the electrically insulating transparent substrates to provide electrically conductive and transparent coatings. These transparent substrates typically have transmittances at about 550 nm wavelength of at least 60% or preferably at least 80%. Examples of transparent substrates are lenses, prisms, optical windows and flat panels. These transparent substrates in general have mechanical integrity such that they are useful for various applications.

The transparent substrates being coated may be of any shape, including simple rectangular and flat shapes as well as complicated shapes having curvatures and bends. The transparent substrates may comprise electrically insulating polymers, glasses, ceramics, or hybrids of these materials. Polymeric substrates may comprise poly(methyl methacrylate) (PMMA), polycarbonate (PC), poly(ethylene terephthalate) (PET), polystyrene, poly(diethylene glycol-bis-allyl carbonate) (ADC) or CR-39®, triacetyl cellulose (TAC), poly(ethylene-2,6-naphthalate) (PEN), or the like.

The electrically conductive transparent coatings may be deposited on the transparent substrates from coating compositions comprising carbon nanotubes filled with or filled and coated with non-carbon compounds. The coating compositions may further comprise solvents, monomers, polymers, surfactants, adhesion promoters or the like. The solvent may be organic solvents such as dimethyl formamide (DMF). The solvent may also be water. Mixtures of different solvents may also be used to prepare such compositions. The surfactants may be useful in obtaining better dispersions of organized assemblies in the coating compositions. In one embodiment of the coating composition, anionic surfactants are used. Examples of such surfactants are sodium cholate hydrate and sodium dodecyl sulfate. In another embodiment, cationic surfactants such as cetyl trimethylammonium bromide are used. One or more of these surfactants may be used for preparation of coating compositions comprising water.

Figure 2:
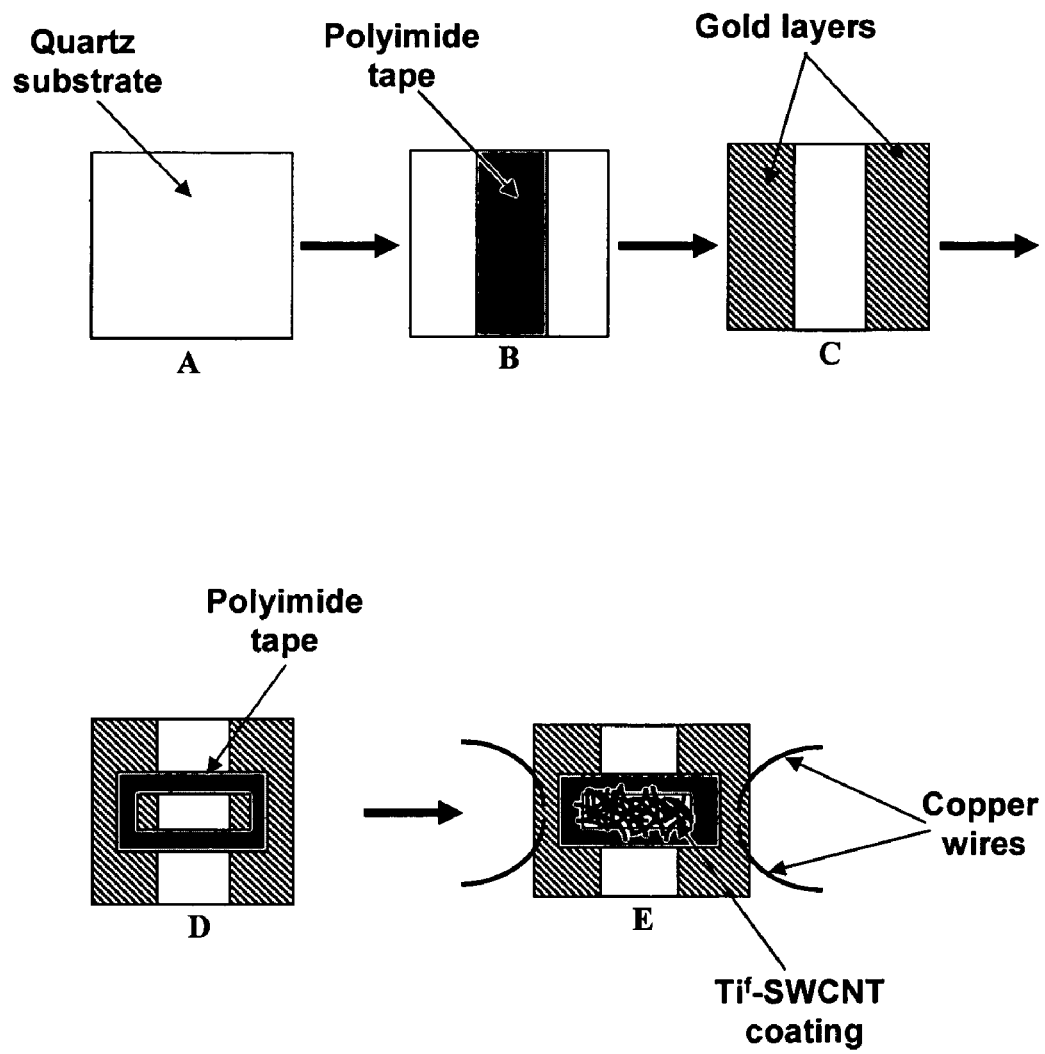
FIG. 2 schematically shows the preparation of a coating comprising organized carbon and non-carbon assembly.

The coating composition may be deposited onto the optical substrates using any suitable coating technique commonly known in the industry. These coating techniques include, for example, dip-coating, spin-coating, roll-coating, flow-coating, drop-coating, spray-coating and meniscus-coating. After the liquid coating composition is deposited, the volatile material comprising solvents or surfactants is removed. This removal may be achieved by heat treatment. The electrically conductive transparent coatings of this invention are thereby obtained. One method of preparation of an electrically conductive transparent coating is schematically shown in FIG. 2 and illustrated in Example 12. Another method of preparation of this coating is illustrated in Example 14. There may be many more methods for preparation of the coatings of this invention. All of them are within the scope of this invention.

The present invention is also directed to devices comprising the electrically insulating transparent substrates and the electrically conductive transparent coatings of the instant invention. Examples of such devices are solar cells, light emitting diodes (LEDs), display devices, infra-red (IR) detectors, photovoltaics, optical field-effect transistors, optical modulators, lasers, optical communication devices, and solid state lighting. Examples of display devices are field emission displays (FEDs), liquid crystal displays (LCDs), plasma display panels (PDPs), electroluminescence displays (ELDs), cathode ray tube displays (CRTs), fluorescence tube displays, and the like. The electrically conductive transparent coatings of this invention replace the conventional coatings in the devices. For example, for liquid crystal displays, the conventional ITO electrodes can be replaced with the coatings of this invention. For field emission displays, the conventional ITO anodes can be replaced with the coatings of this invention. For plasma display panels, the conventional display electrodes can be replaced with the coatings of this invention.

These display devices are used in manufacturing of flat panel video displays, personal digital assistants (PDAs), cellular phones, vehicle dashboards, projection screens, handheld games, and the like.

Transparent Conductive Coatings Comprising Halogen-Treated Carbons

This invention is also directed to transparent conductive coatings comprising halogen-treated-carbons and methods of preparation of such coatings. This type of coatings is hereafter also referred as halogen-treated carbon coatings, for example bromine-treated SWCNT coating.

Halogens suitable for preparation of halogen-treated carbon coatings may comprise a halogen; such as iodine, bromine, an interhalogen compound (such as IBr, $ICl_3$, $BrF_3$), or a mixture thereof.

The halogen incorporation may be in the form of filling, coating or both filling and coating. Forms and preparation of carbon nanotubes comprising halogens are described above in detail. After the halogen-containing nanotubes are prepared, the halogen is removed.

The halogen removal may be partial or complete. Thus, the halogen-treated-carbon coatings may contain any level of halogen. The halogen removal may be achieved by sublimation, evaporation, or thermal degradation. The halogen removal may also be achieved by reacting the halogenated intermediate with a suitable reactant, for example, hydrogen. The halogen removal may also be achieved by washing the halogenated intermediate with a suitable solvent. The halogen removal methods described above in detail may be applied to prepare the halogen-treated-carbon coatings of this invention.

The present invention is also directed to an article comprising a transparent substrate and an electrically conductive transparent coating deposited on the transparent substrate; the coating comprises carbon nanotubes that were previously reacted with a halogen precursor comprising a halogen or an interhalogen compound, then the halogen was completely or partially removed. As used herein, when the halogen is completely removed, the halogen content of the coating is less than 1 weight %, preferably less than 0.1 weight %, or more preferably less than 0.01 weight %. The inventors have discovered that when halogens were first incorporated in carbon nanotubes and then subsequently removed (partially or completely) from the carbon nanotubes, the transparency and electric conductivity of the coating improve over the starting carbon nanotubes.

The transmittance of the above-described coating at about 550 nm wavelength is at least 30%, preferably at least 60%, and more preferably at least 80%. The surface (i.e. sheet) resistance of the coatings of the present invention is no more than $50 \times 10^3$ ohms/square, preferably no more than $10 \times 10^3$ ohms/square, and more preferably no more than $1 \times 10^3$ ohms/square.

In one embodiment of this invention, the above-described article is prepared by the method comprising the steps of: reacting carbon nanotubes with a halogen precursor comprising a halogen or an interhalogen compound to obtain halogen-containing carbon nanotubes, depositing the halogen-containing carbon nanotubes on a transparent substrate to form a coating on the substrate, and then removing the halogen contents partially or completely from the coating.

In another embodiment of this invention, the above-described article is prepared by the method comprising the steps of: reacting carbon nanotubes with a halogen precursor comprising a halogen or an interhalogen compound to obtain halogen-containing carbon nanotubes, removing the halogen contents partially or completely from the halogen-containing carbon nanotubes, and then depositing the carbon nanotubes on a transparent substrate.

The invention is illustrated further by the following examples that are not to be construed as limiting the invention in scope to the specific procedures or products described in them.

EXAMPLES

Example 1

Ti Filled SWCNTs

In this example, the single-wall carbon nanotubes (SWCNTs) were filled with titanium (Ti). SWCNTs were purchased from Carbon Solutions Inc. (Riverside, Calif.) with a catalog number P2-SWNT. They were manufactured by using the arc process. These SWCNTs, designated as "Starting SWCNTs", were processed with minimal exposure to the external environment as follows. The SWCNTs, weighed about 82 mg, were placed in a 50 ml three-necked round bottom Pyrex flask, which was equipped with a heating mantle, a thermocouple and an addition arm. The flask was connected to a vacuum system through a liquid nitrogen trap.

The titanium iodide crystals ($TiI_4$) used in this example were purchased from Sigma-Aldrich (St. Louis, Mo.) with a catalog number 41,359-3. The iodine crystals ($I_2$) were purchased from Sigma-Aldrich with a catalog number 20,777-2. $TiI_4$ (about 1.8 grams) was mixed with $I_2$ (about 1.8 grams) in a nitrogen-filled glove box and placed in the flask addition arm. The end of the addition arm was covered to protect the mixture from atmospheric moisture. The addition aim was then taken out of the glove box and connected to the reaction flask. Thus, the SWCNTs and the $TiI_4/I_2$ mixture initially were kept in separate locations in the flask.

After the connection, the flask was immediately evacuated to a pressure below 1 Torr. The contents of the flask were then heated to about 150° C. in vacuum for about 15 minutes to remove volatile species from the SWCNTs. After this heating, the vacuum valve was closed and the $TiI_4/I_2$ mixture was poured on the SWCNTs by tipping the addition arm. The heating was continued in order to melt the $TiI_4/I_2$ mixture and soak the SWCNTs in the melt as follows. First, after the mixture was poured, the flask was heated to about 200° C. within about 6 minutes. Then, it was further heated to about 275° C. within about 12 minutes. Upon reaching about 275° C., the vacuum valve was opened to remove some un-reacted $TiI_4/I_2$ by evaporation into the cold trap. The heating was continued in vacuum at about 275° C. for about 1 hour. The contents of the flask were then cooled to room temperature by cutting power to the heating mantle. At this step, the nanorods comprised $TiI_4/I_2$ coated and filled SWCNTs.

These $TiI_4/I_2$ coated and filled SWCNTs were processed to remove $TiI_4$ and $I_2$ coating by an ethanol washing step as follows. After the cooling, the flask was transferred to the glove box filled with nitrogen. The nanorods were first mixed with about 25 ml ethanol (Sigma-Aldrich, catalog number 45,984-4) to prepare a suspension. This suspension was then taken out of the glove box and centrifuged at a centrifugal force of about 10,000 g for about 15 minutes to obtain a supernatant phase and a precipitate phase. The supernatant phase was carefully removed by using a pipette and discarded. This washing step was repeated once. The precipitate phase was then transferred back to the glove box and it was dried at about 25° C. to remove residual ethanol. In the ethanol washing step, the centrifugation step may be replaced with a filtration step to recover the nanorods from the suspension. At this step, the nanorods comprised $TiI_4/I_2$ filled SWCNTs.

The $TiI_4/I_2$ filled SWCNTs were processed to remove iodine by a heat treatment step as follows. The precipitate phase was placed in a quartz tube, which was inserted in a tube furnace. The tube was sealed, connected to a vacuum system and evacuated to about 30 mTorr pressure. The furnace was then heated to about 500° C. within one hour. The heating was continued at about 500° C. for about 30 minutes. After this heating period, a gas mixture consisting essentially of about 3% hydrogen and about 97% argon was introduced into the quartz tube and the pressure was raised to about 10 Torr. The heating was further continued at a furnace temperature of about 500° C. for about two hours at about 10 Torr in the flowing gas mixture, after which the furnace was cooled to room temperature.

The Ti filled SWCNTs were thereby obtained. This organized assembly is designated as $Ti^{f}$-SWCNT, where superscript "f" refers "filled".

Example 2

Ti Filled and Coated SWCNTs

In this example, the Starting SWCNTs were filled and coated with titanium (Ti). These SWCNTs were purchased from Carbon Solutions Inc. with a catalog number P2-SWNT. The SWCNTs were processed with minimal exposure to the external environment as follows. The SWCNTs (about 0.5 gram) were placed in a 50 ml three-necked round bottom Pyrex flask, which was equipped with a magnetic stirrer, a thermocouple and two addition arms. The ends of the addition arms were covered to protect the mixture from atmospheric moisture. The flask was connected to a vacuum system through a liquid nitrogen trap and was immediately evacuated to a pressure below 1 Torr. The contents of the flask were then heated to about 150° C. in vacuum for about 15 minutes to remove volatile species from the SWCNTs. Then, the flask was cooled to the room temperature and filled with nitrogen.

Liquid bromine ($Br_2$) used in this example was purchased from Sigma-Aldrich with a catalog number 277576. $TiI_4$ (about 2.5 grams) was placed in one of the flask addition arms and $Br_2$ (about 5 ml) in the other arm in a nitrogen-filled glove box. The addition arms were then taken out of the glove box and connected to the reaction flask. Thus, the SWCNTs, the $TiI_4$, and $Br_2$ initially were kept in separate locations in the flask.

Then, $Br_2$ was added on the SWCNTs by tipping the arm and the mixture was stirred for about two hours. After this mixing, $TiI_4$ was slowly added on the mixture within 5 minutes by tipping the other arm. This addition initiated the reaction. After the reaction was continued for about two hours, a heating mantle and a condenser were connected to the flask, the temperature was raised to about 275° C., and the un-reacted bromine was removed from the mixture by evaporation. After this removal, the flask was cooled to about 100° C. and a vacuum was applied to remove remaining un-reacted $Br_2$. The flask was then cooled to a room temperature. Granules of $TiI_4/Br_2$ filled and coated SWCNTs were thereby obtained.

These granules were processed to remove bromine and iodine by a heat treatment step as follows. First, they were inserted in a tube furnace. The tube was sealed, connected to a vacuum system and evacuated to about 30 mTorr pressure. After this evacuation, a gas mixture consisting essentially of about 5% hydrogen and about 95% argon was introduced into the quartz tube and the pressure was raised to about 10 Torr. The furnace was then heated to about 500° C. within one hour. The heating was continued at about 500° C. for about 30 minutes. After this heating period, the temperature was raised to about 600° C. within 30 minutes and kept at this temperature for about 4 hours at about 10 Torr in the flowing gas mixture. This was followed by cooling the furnace to about 400° C. within 30 minutes and keeping at this temperature for about 30 minutes. Then, the furnace was further cooled to about 100° C. within about 4 hours and kept at about 100° C. for about 10 hours. Finally, the furnace was cooled to a room temperature.

Ti filled and coated SWCNTs were thereby obtained. This organized assembly is designated as $Ti^{f\&c}$-SWCNT, where superscript "f&c" refers "filled and coated".

Example 3

$TiH_w$ Filled SWCNTs

In this example, the starting SWCNTs were filled with $TiH_w$. The "w" varies in the range of 0 to 2. The starting SWCNTs were purchased from Carbon Solutions Inc. with a catalog number P3.2-SWNT. The starting SWCNTs were processed with minimal exposure to the external environment as follows. The SWCNTs (about 135 mg) were placed in a 50 ml three-necked round bottom Pyrex flask, which was equipped with a heating mantle and a thermocouple. The ends of the necks were covered to protect the mixture from atmospheric moisture. The flask was connected to a vacuum system through a liquid nitrogen trap. To remove adsorbed volatile matter, the SWCNTs were heated at a temperature in the range of 150° C. to 200° C. for about 20 minutes in vacuum. Then, the flask was cooled to the room temperature and filled with nitrogen.

The liquid $Br_2$ (about 30 ml) was added to a 100 ml three-necked round bottom Pyrex flask with addition arms. The ends of the addition arms were covered with rubber septas to protect the mixture from atmospheric moisture. $TiI_4$ (about 13.5 grams) was placed in one of the flask addition arms. $TiI_4$ was then added slowly to the $Br_2$ within about 10 minutes. The mixture was stirred for about 64 hours to allow the crystals of $TiI_4$ to thoroughly dissolve in $Br_2$.

After this dissolution was achieved, $TiI_4/Br_2$ solution (about 10 ml) was withdrawn from the flask and added to the flask that contained the SWCNTs. The suspension thereby obtained was magnetically stirred for about 16 hours by using a stir bar. A condenser was then added to the flask and the $Br_2$ was distilled off of the suspension. Additional $Br_2$ removal was achieved by heating the flask to about 100° C. under vacuum. The flask was then cooled to a room temperature.

The halogenated intermediate thereby obtained was processed to remove its $TiI_4$ coating by an ethanol washing step as follows. The nanorods were first mixed with about 50 ml ethanol to prepare a suspension. This suspension was then centrifuged at a centrifugal force of about 10,000 g for about 5 minutes to obtain a supernatant phase and a precipitate phase. The supernatant phase was carefully removed by using a pipette and discarded. This washing step was repeated five times. The precipitate phase was then transferred back to the glove box and it was dried at about 25° C. to remove residual ethanol.

The halogenated intermediate was further processed to remove iodine by a heat treatment step as follows. The dried precipitate phase was placed in a quartz tube, which was inserted in a tube furnace. The tube was sealed, connected to a vacuum system and evacuated to about 100 mTorr pressure. After this evacuation, a gas mixture consisting essentially of about 5% hydrogen and about 95% argon was introduced into the quartz tube with a flow rate of about 3.5 liters/minute and the pressure was raised to a pressure in the range of 15 Torr to 20 Torr. The quartz tube was purged with at least 3 times with this gas mixture before the heating started.

The heat treatment of the halogenated intermediate was carried out in this gas mixture in four process steps. In the first step, the furnace was heated to about 500° C. at a heating rate of about 750° C./hour and kept at this temperature for about 0.5 hours. In the second step, the furnace was heated to about 600° C. at a heating rate of about 200° C./hour and kept at this temperature for about 4 hours. In the third step, the furnace was cooled to about 400° C. at a heating rate of about 400° C./hour and kept at this temperature for about 0.2 hours. In the fourth step, the furnace was cooled to about 100° C. at a heating rate of about 75° C./hour and kept at this temperature for about 10 hours. Finally, the furnace was cooled to a room temperature.

The $TiH_w$ filled SWCNTs (i.e. $TiH_w^f$-SWCNT) were thereby obtained.

Examples 4 to 9

Metal Filled and Coated SWCNTs

In these examples, the starting SWCNTs were both filled and coated with various metals in the same manner as described in Example 1, except that iodides (about 1 gram) of Mn, Fe, Co, Ni, Pd, or Pt were used instead of $TiI_4$. Mn filled and coated SWCNTs, Fe filled and coated SWCNTs, Co filled and coated SWCNTs, Ni filled and coated SWCNTs, Pd filled and coated SWCNTs, or Pt filled and coated SWCNTs were thereby prepared.

The organized assemblies comprising SWCNTs filled and coated with variety of metals were thereby obtained.

Example 10

$Br_2$ Filled SWCNTs

In this Example, the SWCNTs were filled with bromine ($Br_2$). The Starting SWCNTs were purchased form Carbon Solutions Inc. with a catalog number P2-SWNT and processed with minimal exposure to the external environment as follows. The Starting SWCNTs (about 400 mg) were placed in a 50 ml capacity 3-neck flask, equipped with a vacuum pickup, two glass stoppers, and a heating mantle and the flask was immediately evacuated to a pressure below 1 Torr. The contents of the flask were then heated to a temperature in the range of 150° C. to 200° C. in vacuum for about 20 minutes to remove volatile species from the SWCNTs.

After the removal of volatiles, the flask was cooled to a room temperature and filled with nitrogen. About 10 ml of $Br_2$ (99.5+ %, Sigma-Aldrich catalogue number 277576-450G) was then introduced into the flask through an addition funnel. The mixture was magnetically stirred while the temperature of the flask and contents was raised to a temperature in the range of 40° C. to 59° C. and kept at this temperature for about 2 hours. After this heating, the un-reacted bromine was distilled off at about 100° C. The un-reacted bromine was further removed by evacuating the flask and contents for about 5 minutes.

The organized assemblies comprising $Br_2$ filled SWCNTs (i.e., $Br^f$-SWCNTs) were thereby prepared.

Example 11

$I_2$ Filled SWCNTs

In this Example, the SWCNTs were filled with iodine ($I_2$). The starting SWCNTs were purchased form Carbon Solutions Inc. with a catalog number P2-SWNT and processed with minimal exposure to the external environment as follows. The starting SWCNTs (about 200 mg) were placed in a 50 ml capacity 3-neck flask, equipped with a vacuum pickup, two glass stoppers, and a heating mantle and the flask was immediately evacuated to a pressure below 1 Torr. The contents of the flask were then heated to about 150° C. in vacuum for about 20 minutes to remove volatile species from the SWCNTs.

After the removal of volatiles, the flask was cooled to a room temperature and filled with nitrogen. An addition arm, filled with $I_2$ crystals (about 15 g), and a magnetic stir bar were added to this flask. The $I_2$ crystals were mixed with the SWCNTs by tipping the addition arm. The mixture was magnetically stirred while the temperature of the flask and contents was raised to about 150° C. and kept at this temperature for about 2 hours. After this heating, the un-reacted $I_2$ was distilled off at about 100° C. under vacuum. After no more iodine was seen to evolve, the flask was cooled to a room temperature, filled with nitrogen, and transferred to the nitrogen-filled glove box.

The nanorods thereby obtained were then scraped out of the flask and was washed with ethanol to remove $I_2$ coating from the nanorod walls as follows. The nanorods were first mixed with about 50 ml ethanol to prepare a suspension. This suspension was then centrifuged at a centrifugal force of about 10,000 g for about 5 minutes to obtain a supernatant phase and a precipitate phase. The supernatant phase was carefully removed by using a pipette and discarded. This washing and centrifuging steps were repeated five times. The precipitate phase was then transferred back to the glove box and it was dried at about 25° C. to remove residual ethanol.

The organized assemblies comprising $I_2$ filled SWCNTs (i.e., $I^f$-SWCNTs) were thereby prepared.

Example 12

Measurement of Electrical Conductivity

In this example, electrical conductivities of the organized assemblies of carbon and non-carbon materials prepared in Examples 1 to 11 were determined as follows. First, a quartz slide with a thickness of about 1.0 mm (Ted Pella, Inc. Prod. #26011) was cut into an about 1 cm×about 1 cm square substrate (FIG. 2A). These substrates were cleaned in two steps as follows. In a first cleaning step, the substrates were placed in a 4 to 5 weight percent detergent/water solution and sonicated for about 5 minutes. These substrates were then washed with deionized water for at least one minute and finally dried by blowing dry nitrogen gas. In a second cleaning step, a solution was prepared to contain deionized water, hydrogen peroxide and ammonium hydroxide with a volume ratio of about 5:1:1 respectively. The quartz substrates cleaned in the first step were placed in this solution and heated at about 80° C. for at least 20 minutes. These substrates were then washed with deionized water for at least one minute and finally dried by blowing dry nitrogen gas. About 2 mm×about 1 cm strip of polyimide tape was then placed at the center of the cleaned quartz substrate to function as a mask for subsequent evaporation and sputtering of chromium and gold respectively onto the top surface of the quartz substrates (FIG. 2B). The masked quartz substrate was then placed inside a sputter coater (Denton Vacuum DV-502A). A chromium layer of average thickness no more than about 100 Å was first deposited on this substrate to act as an adhesion layer (not shown in FIG. 2). Then, a gold layer with an average thickness of about 2000 Å was deposited on this chromium layer and the mask was removed (FIG. 2C). The gold-deposited quartz substrate was then covered with a strip of polyimide tape, cut to provide a window of dimension about 4 mm×about 2 mm and placed onto the substrate so as to bridge the sputtered gold areas (FIG. 2D). Two pairs of thin copper wires were made to connect to each gold deposit area by compression loading (FIG. 2E).

An organized assembly, for example Ti filled SWCNTs obtained in Example 1, (about 1 mg) was mixed with about 5.0 milliliter of anhydrous dimethylformamide (DMF, Acros catalog number 61032-0010). This mixture was then sonicated using a horn sonicator (Sonics Materials, Model VC600) at about 600 W power and about 20 MHz frequency for about 5 minutes. This sonication step was repeated three times. A dispersion of the organized assembly was thereby obtained.

This dispersion was deposited drop by drop on the open area of the polyimide tape by using a syringe (3 ml capacity) equipped with a blunted needle (18 G). This deposition was continued until all the open area was covered with a dispersion layer. The dispersant was first allowed to slowly evaporate from the dispersion layer by forced air flow at room temperature. Then, the quartz substrate was placed in a forced air convection oven at about 130° C. for about 30 minutes for further removal of the dispersant. After this drying, a thick coating comprising the organized assembly connecting the two gold layers was formed.

The CNT coated quartz substrate was mounted into a custom-built electrical characterization equipment (ECE) system. The two pairs of copper wire serving as electrical contact pairs (two current carrying and two voltage sensing) were pressed between opposite gold deposit areas of the quartz substrate and a top insulating mounting plate in a Kelvin-type probe configuration to facilitate 4-point probe measurements of D.C. resistance of the coating.

Figure 3:
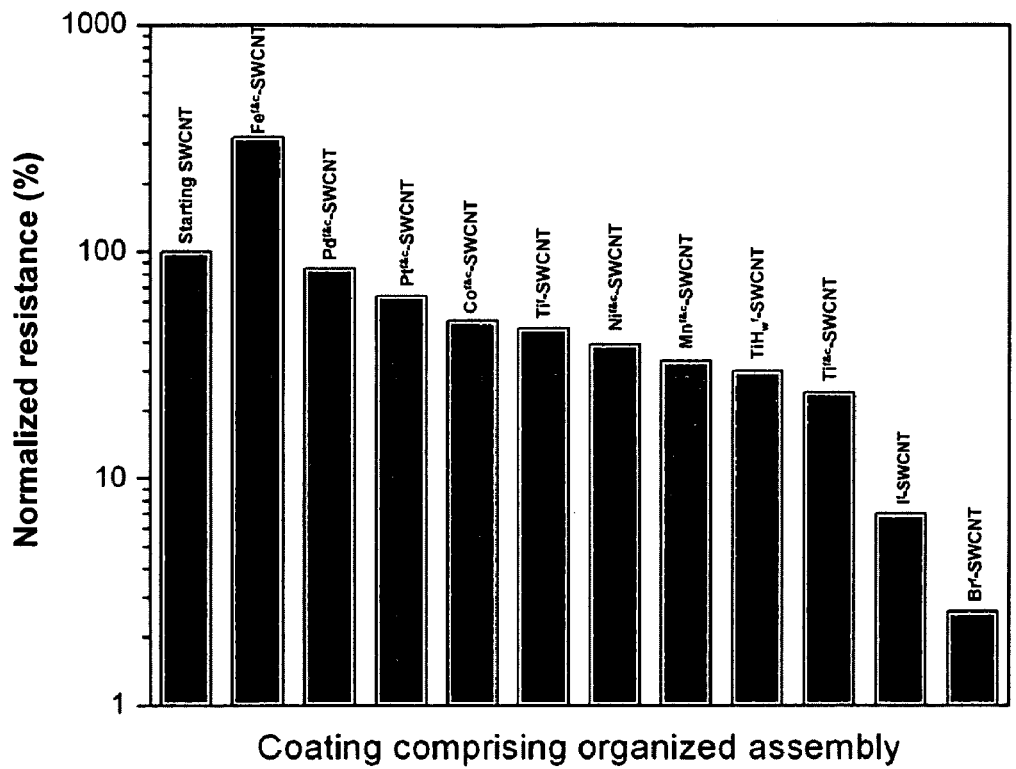
FIG. 3 schematically shows normalized D.C. resistances of coatings comprising organized carbon and non-carbon assemblies.

The results are shown in Table 1. These results were normalized against the Starting SWCNTs and plotted in FIG. 3.

TABLE 1

Electrical resistance of coatings comprising organized assembly of carbon and non-carbon compounds.

| Organized Assembly | D.C. Resistance (ohms) | Normalized D.C. Resistance (%) |
|---|---|---|
| $Br^f$-SWCNT | 31 | $2.6 \times 10^{-2}$ |
| $I^f$-SWCNT | 84 | $7.0 \times 10^{-2}$ |
| $Ti^{f\&c}$-SWCNT | 285 | $2.4 \times 10^{-1}$ |
| $TiH_x^f$-SWCNT | 359 | $3.0 \times 10^{-1}$ |
| $Mn^{f\&c}$-SWCNT | 395 | $3.3 \times 10^{-1}$ |
| $Ni^{f\&c}$-SWCNT | 469 | $3.9 \times 10^{-1}$ |
| $Ti^f$-SWCNT | 551 | $4.6 \times 10^{-1}$ |
| $Co^{f\&c}$-SWCNT | 607 | $5.0 \times 10^{-1}$ |
| $Pt^{f\&c}$-SWCNT | 770 | $6.4 \times 10^{-1}$ |
| $Pd^{f\&c}$-SWCNT | 1027 | $8.5 \times 10^{-1}$ |
| Starting SWCNT | 1203 | $1.0 \times 10^{-0}$ |
| $Fe^{f\&c}$-SWCNT | 3826 | $3.2 \times 10^{-0}$ |

These results demonstrate that the electrical conductivity of thick coatings was substantially increased by incorporating non-carbon compounds (except Fe) to pure SWCNTs. This incorporation reduces the D.C. resistance as compared to pure SWCNTs. This reduction may even reach to more than an order of magnitude for the organized assemblies comprising bromine and iodine. It was also observed that the coating thickness affected the electrical conductivity and transparency of the coating.

Example 13

Optical Transmission of Ti Filled and Coated SWCNTs

In this example, optical transmission of Ti filled and coated SWCNTs were compared with that of the Starting SWCNTs. The organized assemblies were prepared in the same manner described in Example 2, except that SWCNTs purchased from Carbon Solutions Inc. with a catalog number P3.2-SWNT were used as the starting SWCNTs instead of P2-SWNT and the reaction time was about 94 hours instead of two hours.

A suspension was prepared by adding $Ti^{f\&c}$-SWCNTs (about 5 mg) to dimethyl formamide (DMF) solution (about 25 ml) and sonicating for about one hour, using a high-power horn-sonicator manufactured by Sonics and Materials (Newton, Conn.). This suspension was diluted by DMF until optical absorbance of 0.2 at about 2150 nm was obtained. Another suspension was similarly prepared by using Starting SWCNTs. The transmission of these suspensions was measured by using the Cary 500 UV-Vis-NIR spectrophotometer manufactured by Varian Inc. (Palo Alto, Calif.). The instrument was set on double beam mode, and 1 cm thick quartz cuvettes were used to hold the suspensions. The blank was filled with pure DMF.

Figure 4:
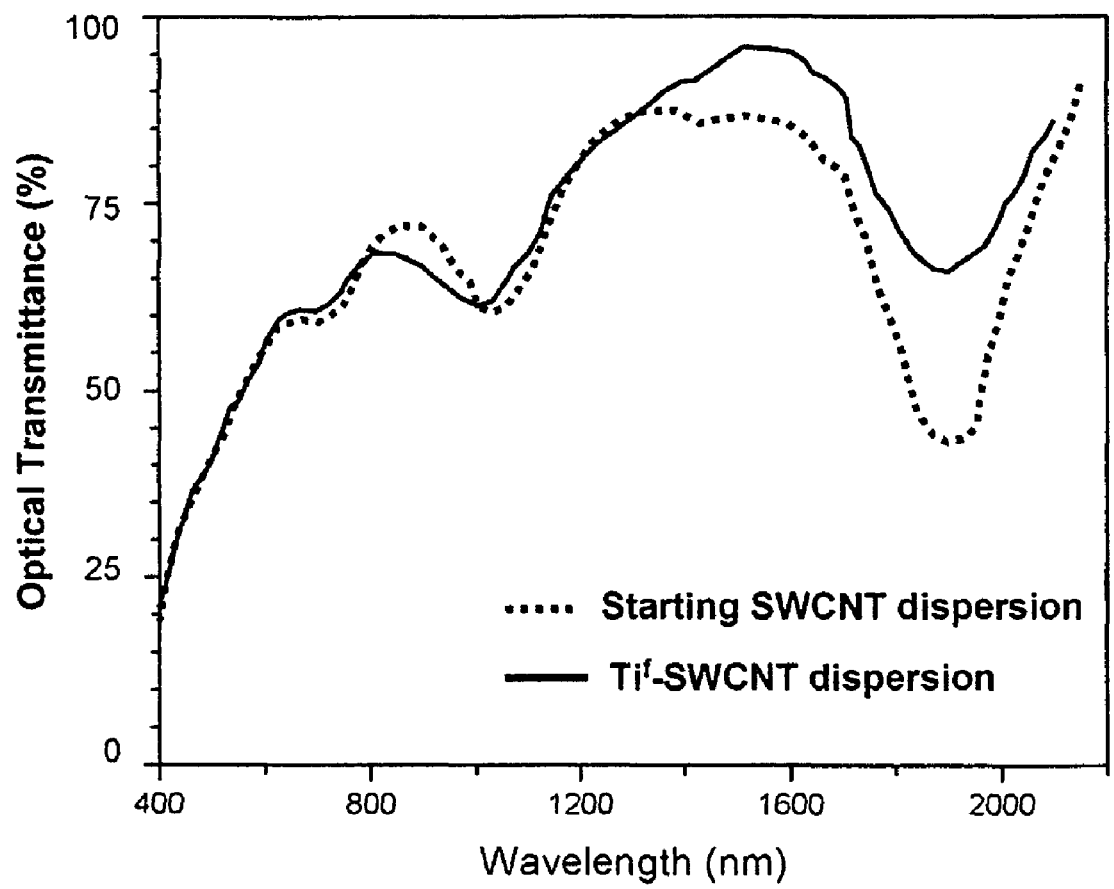
FIG. 4 shows visible-near infra red transmission spectra of a dispersion comprising titanium filled SWCNTs and a dispersion comprising Starting SWCNTs.

The results are shown in FIG. 4. There was almost no difference in transparency between the Starting SWCNT and the $Ti^{f\&c}$-SWCNTs in the range of 400 nm to 1,300 nm. The transparency increased for the $Ti^{f\&c}$-SWCNTs in the range of 1,300 nm to 2,100 nm.

Taken together, the results of Examples 12 and 13 demonstrated that the coatings comprising organized assemblies of carbon and non-carbon compounds may have better electrical conductivity and better transparency as compared to the coatings comprising only carbon.

Example 14

Preparation of Coatings Comprising Bromine Filled SWCNTs

In this example, coatings comprising $Br^f$-SWCNTs were deposited on glass substrates by using nanorods prepared in Example 10. This deposition was achieved in several process steps as follows.

In the first step, $Br^f$-SWCNT nanorods were dispersed in water by using a surfactant, sodium cholate hydrate. This surfactant (about 98% pure) was purchased from Sigma-Aldrich with a catalog number 270911. To prepare the dispersion, $Br^f$-SWCNTs (about 1 mg) were mixed with a solution comprising deionized water (about 50 ml) and sodium cholate hydrate (about 150 mg). After the preparation, this mixture was immediately sonicated by using a horn sonicator manufactured by Sonic Materials with a model number VC 600 in three cycles for about 10 minutes for each cycle.

In the second step, this dispersion was filtered to form a coating on a first filter paper. First, a vacuum filtration apparatus comprising a 0.22 micrometer methyl cellulose ester (MCE) membrane filter (first filter paper) was assembled. Then, a predetermined volume (in the range of 0.5 ml to 5 ml) of the dispersion was mixed with about 300 ml of deionized water and this mixture was filtered under vacuum until a circular coating was formed on the first filter paper.

In the third step, this coating was first covered by a first borosilicate glass substrate about 75 mm×about 50 mm×about 1 mm Fisherbrand Microscope Slide, which was purchased from Fisher Scientific (Waltham, Mass.) with a catalogue number 12-550 C. Then, the first filter paper was wetted with deionized water and a second glass substrate was pressed on the first filter paper by carefully applying a pressure until all visible bubbles were removed.

The second glass substrate was replaced with a damp second filter paper. This assembly was pressed with a pressure of about 250 grams/cm by using a suitable clamp. And the assembly was placed in an oven heated at about 70° C., dried overnight at this temperature and finally cooled to a room temperature. After cooling, the second filter paper was peeled off from the first filter paper.

In the fourth step, the first filter paper was carefully dissolved in an acetone bath until no visible residue from the filter remained. Then, it was blow dried with nitrogen. The coating comprising $Br^f$-SWCNT was thereby obtained on glass substrates.

By changing the volume of the dispersion, the amount of the coating deposited on the glass substrate was varied. A variety of coatings with different amounts were thereby prepared by starting about 0.5 ml of the dispersion and increasing this volume up to about 5.0 ml. The diameter of these circular coatings was about 3.0 cm. The variation of amount of deposited nanorods on the glass substrate affected the optical transmission and the electrical resistance of the coating.

Coatings comprising Starting SWCNTs were also prepared in the same manner described in this example, except that the Starting SWCNTs were used instead of $Br^f$-SWCNTs.

The surface electrical resistance of above coatings was determined by using a two-probe multimeter, Model 189 True RMS, manufactured by Fluke Corporation (Everett, Wash.). Each probe of the multimeter was placed on the circular coating and moved across its diameter until the resistance value was steady. The spacing between the probes was about 3 cm. The surface resistance was reported as ohms/square. At least eight measurements were taken at different locations on the circular coating. The mean of these measurements was reported for each coating. The standard deviation was within a range of 3% to 5%. The optical transmission of the coatings was determined by using a Cary 500 ultraviolet-visible-near infrared (UV-Vis-NIR) spectrophotometer manufactured by Varian Inc. (Palo Alto, Calif.). The optical transmission data were collected in the wavelength range of 400 nm to 2,000 nm. The optical transmission data was reported at about 550 nm wavelength. The thickness of the coatings was measured by a stylus profiler, Sloan Dektak Model 3030 ST Auto 1 Surface Texture Profiler, manufactured by Veeco (Plainview, N.Y.).

Figure 5:
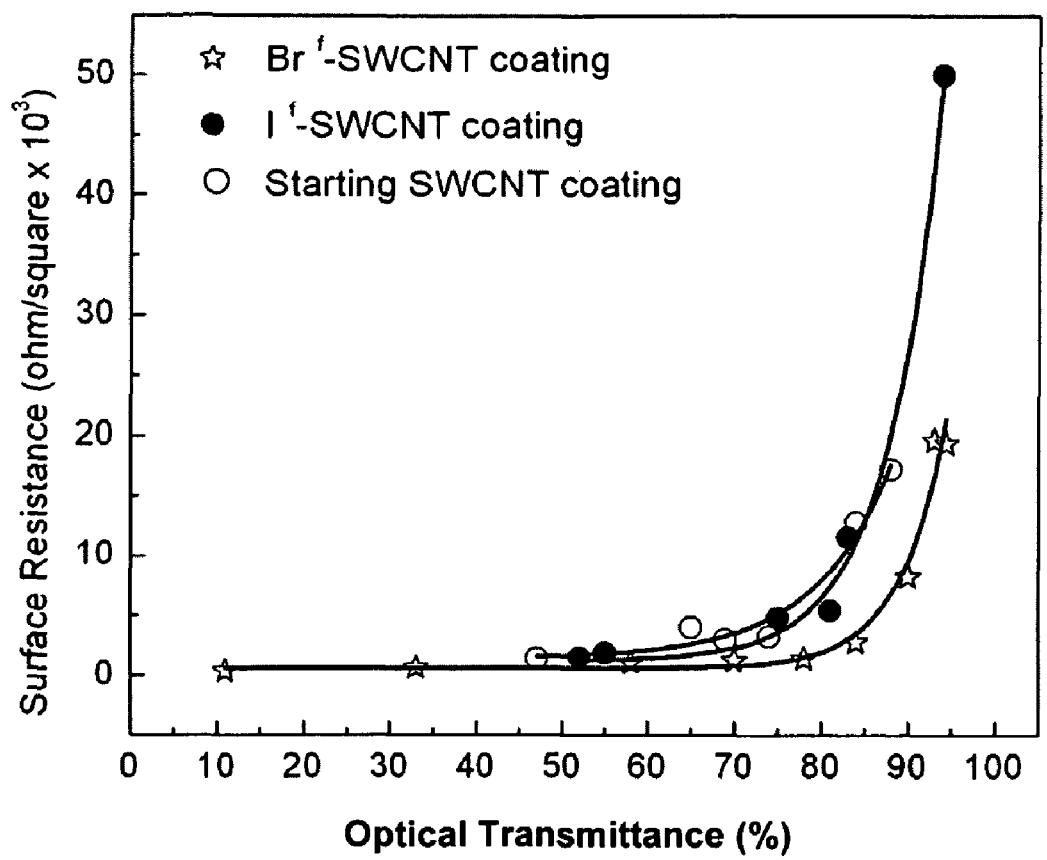
FIG. 5 shows surface electrical resistance of $Br^f$-SWCNT, $I^f$-SWCNT and Starting SWCNT coatings as a function of their optical transmission at about 550 nm wavelength.

The results were schematically shown in FIG. 5 and numerically presented in Tables 2 to 3.

TABLE 2

Coating thickness, surface electrical resistance and optical transmittance of $Br^f$-SWCNT coatings on the glass substrates.

| Coating thickness (nm) | Surface electrical resistance (ohms/square) × $10^3$ | Transmittance at 550 nm (%) |
|---|---|---|
| 51 ± 5 | 19.4 | 95 |
| 102 ± 10 | 8.3 | 90 |
| 179 ± 16 | 2.8 | 84 |
| 256 ± 23 | 1.4 | 78 |
| 359 ± 32 | 1.2 | 70 |
| 512 ± 46 | 1.0 | 58 |
| 1,025 ± 90 | 0.65 | 33 |
| 1,537 ± 138 | 0.35 | 11 |

TABLE 3

Coating thickness, surface electrical resistance and optical transmittance of Starting SWCNT coatings on the glass substrates.

| Coating thickness (nm) | Surface electrical resistance (ohms/square) × $10^3$ | Transmittance at 550 nm (%) |
|---|---|---|
| 103 ± 5 | 17.2 | 88 |
| 200 ± 6 | 12.8 | 84 |
| 310 ± 16 | 3.3 | 74 |
| 413 ± 21 | 3.0 | 69 |
| 517 ± 26 | 4.0 | 65 |
| 1034 ± 82 | 1.4 | 47 |

The coating thickness affected both the optical transmittance and the surface electrical resistance. The thicker coatings had lower resistances and lower transparencies. The coatings prepared with smaller volumes of the dispersion (lower thickness) had higher optical transmittance and higher electrical resistance than those prepared with larger volumes (higher thickness).

For example, the $Br^f$-SWCNT coatings, which were prepared with about 0.5 ml coating composition (i.e. dispersion) and had about 51 nm thickness, had about 95% transmittance and about $19.4 \times 10^3$ ohms/square surface resistance. The number of physical contacts (i.e. network junctions) between $Br^f$-SWCNTs increased with increasing volume of the coating composition. This caused the resistance to decrease. However, the transmittance decreased together with this resistance decrease. For example, the $Br^f$-SWCNT coatings, which were prepared with about 2 ml coating composition and had about 256 nm thickness, had about 78.0% transmittance and about $1.4 \times 10^3$ ohms/square surface resistance.

The $Br^f$-SWCNT coatings, with a thickness of 1,025 nm, had resistance of about $0.65 \times 10^3$ and optical transmittance of about 33%. The incorporation of $Br^f$-SWCNT yielded coatings with higher transmittance and lower electrical resistance than those of the Starting-SWCNT coatings. For example, at about 84% transmission, the Starting-SWCNT coating had about $13 \times 10^3$ ohms/square surface resistance, whereas the $Br^f$-SWCNT coating had about $2.8 \times 10^3$ ohms/square surface resistance.

These results indicated that the electrical conductivity increased with incorporation of non-carbon into the coatings comprising carbon.

Example 15

Preparation of Coatings Comprising Iodine Filled SWCNTs

In this example, coatings comprising $I^f$-SWCNTs were deposited on glass substrates and they were analyzed in the same manner as disclosed in Example 14, except that $I^f$-SWCNTs prepared in Example 11 were used instead of $Br^f$-SWCNTs.

The results of $I^f$-SWCNTs were schematically shown in FIG. 5 and numerically presented in Table 4.

TABLE 4

Coating thickness, surface electrical resistance and optical transmittance of $I^f$-SWCNT coatings on the glass substrates.

| Coating thickness (nm) | Surface electrical resistance (ohms/square) × $10^3$ | Transmittance at 550 nm (%) |
|---|---|---|
| 105 ± 8 | 50.0 | 94 |
| 374 ± 14 | 12.0 | 83 |

TABLE 4-continued

Coating thickness, surface electrical resistance and optical transmittance of I'-SWCNT coatings on the glass substrates.

| Coating thickness (nm) | Surface electrical resistance (ohms/square) × 10$^3$ | Transmittance at 550 nm (%) |
|---|---|---|
| 525 ± 42 | 5.4 | 81 |
| 730 ± 83 | 4.8 | 75 |
| 903 ± 72 | 1.9 | 55 |
| 1036 ± 83 | 1.5 | 52 |

The incorporation of I'-SWCNT yielded coatings with slightly higher transmittance and slightly lower electrical resistance than those of the Starting-SWCNT coatings. The incorporation of Br'-SWCNT yielded coatings with higher transmittance and lower electrical resistance than those of the Starting-SWCNT coatings.

Example 16

Preparation of Coatings Comprising Bromine-Treated-SWCNTs

In this example, coatings comprising bromine treated SWCNTs were deposited on glass substrates as follows.

First, coatings comprising Br'-SWCNT were deposited on glass substrates in the same manner described in Example 14. After this deposition, these glass substrates were placed in a graphite furnace and heated at about 500° C. for about one hour under vacuum. Then, the substrate was cooled to a room temperature. The coating was then analyzed to determine its bromine content. This analysis was carried out by an energy dispersive x-ray spectrometer (EDS), model Noran System 6 EDS, manufactured by Thermo Fisher Scientific Inc (Waltham, Mass.); connected to a scanning electron microscope (SEM), model JSM-7500F Field Emission-Type Scanning Electron Microscope, manufactured by JEOL Ltd. (Tokyo, Japan). This EDS is manufactured with a detection limit of 0.1 weight %. However, at normal operating conditions, the detection limit is about 1 weight %. There was no observable bromine peak at the EDS spectra. This analysis indicated that this heat treatment reduced Br$_2$ from the coating below 1 weight %. The bromine-treated-SWCNT coatings that did not contain any detectable amount of Br$_2$ were thereby obtained.

Figure 6:
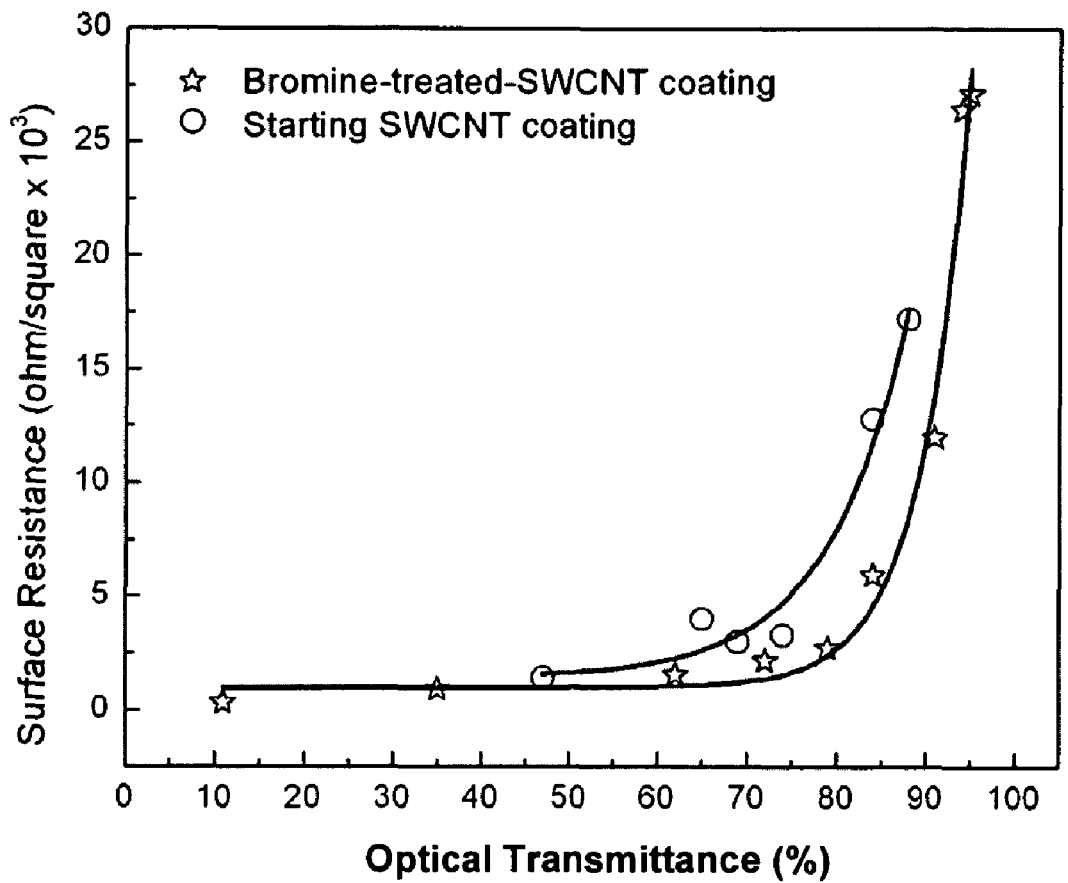
FIG. 6 shows surface electrical resistance of bromine-treated-SWCNT and Starting SWCNT coatings as a function of their optical transmission at about 550 nm wavelength.

The surface electrical resistance and optical transmission of these coatings were determined in the same manner as disclosed in Example 12. The results were compared with those of the Starting SWCNT coatings (see Table 4). The results were schematically shown in FIG. 6 and numerically presented in Table 5.

TABLE 5

Coating thickness, surface electrical resistance and optical transmittance of bromine-treated-SWCNT coatings on the glass substrates.

| Coating thickness (nm) | Surface electrical resistance (ohms/square) × 10$^3$ | Transmittance at 550 nm (%) |
|---|---|---|
| 65 ± 6 | 27.1 | 95 |
| 98 ± 8 | 12.0 | 91 |
| 131 ± 10 | 5.9 | 84 |
| 328 ± 26 | 2.7 | 79 |
| 459 ± 37 | 2.2 | 72 |

TABLE 5-continued

Coating thickness, surface electrical resistance and optical transmittance of bromine-treated-SWCNT coatings on the glass substrates.

| Coating thickness (nm) | Surface electrical resistance (ohms/square) × 10$^3$ | Transmittance at 550 nm (%) |
|---|---|---|
| 656 ± 53 | 1.5 | 62 |
| 1313 ± 105 | 0.93 | 35 |
| 1969 ± 157 | 0.31 | 11 |

The bromine treatment yielded coatings with higher transmittance and lower electrical resistance than those of the Starting SWCNT coatings. For example, at about 84% transmittance, the Starting SWCNT coating had about 13×10$^3$ ohms/square surface resistance; however, the bromine-treated-SWCNT coating had about 6×10$^3$ ohms/square surface resistance. These results indicated that the electrical conductivity increased with the halogen treatment and removal method.

The invention, and the manner and process of making and using it, are now described in such full, clear, concise and exact terms as to enable any person skilled in the art to which it pertains, to make and use the same. It is to be understood that the foregoing describes preferred embodiments of the present invention and that modifications may be made therein without departing from the scope of the present invention as set forth in the claims. To particularly point out and distinctly claim the subject matter regarded as invention, the following claims conclude this specification.

What is claimed is:

1. A method for preparing an article comprising a transparent substrate and an electrically conductive transparent coating, comprising the steps of:
    reacting carbon nanotubes with a halogenated precursor comprising a halogen and a halogenated compound to obtain a halogenated intermediate comprising filled and/or coated carbon nanotubes, wherein the halogenated compound is selected from the group consisting of MgI$_2$, ScI$_3$, ScBr$_3$, YI$_3$, TiI$_4$, VI$_3$, VBr$_3$, MoI$_3$, MnI$_2$, FeI$_2$, CoI$_2$, NiI$_2$, PdI$_2$, PtI$_2$, BI$_3$, PbI$_2$, BiI$_3$, and any combination thereof,
    depositing the halogenated intermediate on a transparent substrate to form an electrically conductive transparent coating on the substrate,
    removing halogen contents partially or completely from the halogenated intermediate,
    whereby the article is prepared.

2. The method according to claim 1, wherein the halogen contents are removed by heating the halogenated intermediate.

3. The method according to claim 2, wherein the halogenated intermediate is heated in a gas mixture comprising hydrogen.

4. The method according to claim 1, wherein the halogen contents are removed by solvent washing.

5. A method for preparing an article comprising a transparent substrate and an electrically conductive transparent coating, comprising the steps of:
    reacting carbon nanotubes with a halogenated precursor comprising a halogen and a halogenated compound to obtain a halogenated intermediate comprising filled and/or coated carbon nanotubes, wherein the halogenated compound is selected from the group consisting of MgI$_2$, ScI$_3$, ScBr$_3$, YI$_3$, TiI$_4$, VI$_3$, VBr$_3$, MoI$_3$, MnI$_2$, FeI$_2$, CoI$_2$, NiI$_2$, PdI$_2$, PtI$_2$, BI$_3$, PbI$_2$, BiI$_3$, and any combination thereof,
    removing halogen contents partially or completely from the halogenated intermediate to form the carbon nanotubes having halogen removed, depositing the carbon nanotubes having halogen removed on a transparent substrate to form an electrically conductive transparent coating on the substrate,
whereby the article is prepared.

6. The method according to claim 5, wherein the halogen contents are removed by heating the halogenated intermediate.

7. The method according to claim 6, wherein the halogenated intermediate is heated in a gas mixture comprising hydrogen.

8. The method according to claim 5, wherein the halogen contents are removed by solvent washing.

* * * * *